United States Patent
Lin et al.

(10) Patent No.: US 12,427,548 B2
(45) Date of Patent: Sep. 30, 2025

(54) CLEANING PROCESS OF WAFER POLISHING PAD AND CLEANING NOZZLE

(71) Applicant: United Semiconductor (Xiamen) Co., Ltd., Fujian (CN)

(72) Inventors: Shih-Jie Lin, Fujian (CN); Ching-Wen Teng, Singapore (SG); Kuo Liang Huang, Singapore (SG); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 407 days.

(21) Appl. No.: 17/555,513

(22) Filed: Dec. 20, 2021

(65) Prior Publication Data
US 2023/0126122 A1 Apr. 27, 2023

(30) Foreign Application Priority Data
Oct. 26, 2021 (CN) .......................... 202111245912.1

(51) Int. Cl.
*B08B 3/02* (2006.01)
*B05B 7/04* (2006.01)
*B24B 7/22* (2006.01)
*B24B 57/02* (2006.01)
*H01L 21/321* (2006.01)

(52) U.S. Cl.
CPC .............. *B08B 3/02* (2013.01); *B05B 7/0483* (2013.01); *B24B 7/228* (2013.01); *B24B 57/02* (2013.01); *H01L 21/3212* (2013.01)

(58) Field of Classification Search
CPC ......... B08B 3/02; B05B 7/0483; B05B 1/005; B05B 15/557; B24B 7/228; B24B 27/02; B24B 37/042; B24B 37/10; B24B 37/34; B24B 53/007; B24B 53/017; B24B 57/02;
(Continued)

(56) References Cited

U.S. PATENT DOCUMENTS 3,289,942 A * 12/1966 Heinicke ................. B60S 3/044
239/101
4,328,107 A * 5/1982 Wright ...................... C02F 1/24
261/78.2
(Continued)

FOREIGN PATENT DOCUMENTS

CN 102554782 A 7/2012
CN 112171513 A 1/2021
(Continued)

OTHER PUBLICATIONS https://web.archive.org/web/20211024152306/https://ultrapureh2otech.com/2020/09/why-is-deionized-water-best-used-for-cleaning/ date: Oct. 24, 2021 (Year: 2021).*

*Primary Examiner* — Robert F Neibaur
(74) *Attorney, Agent, or Firm* — Winston Hsu

(57) ABSTRACT

A cleaning process of wafer polishing pad, the process includes providing a wafer polishing pad, performing a planarization process with the wafer polishing pad, leaving a residue on the wafer polishing pad after the planarization process, and performing a cleaning step with a cleaning nozzle to remove the residue, the cleaning nozzle comprises at least one Y-shaped pipe, one end of which is a water outlet, and the other two ends are respectively a water inlet and an air inlet, wherein a cleaning liquid flows from the water inlet to the water outlet, and a pressurized gas flows in from the air inlet.

14 Claims, 2 Drawing Sheets

(58) Field of Classification Search
CPC ..... B24B 55/02; B24B 55/12; H01L 21/3212; H01L 21/67051
USPC ................ 451/141, 36, 41, 54, 102, 60, 444
See application file for complete search history.

(56) References Cited

U.S. PATENT DOCUMENTS 10,099,262 B2 * 10/2018 Bourdat .................. B01F 25/30
11,577,358 B2 * 2/2023 Kumar .................... B24B 37/34
11,926,018 B2 * 3/2024 Ito ......................... B24B 37/013

FOREIGN PATENT DOCUMENTS

| | | |
|---|---|---|
| KR | 10-2004-0061132 A | 7/2004 |
| TW | 406591 | 9/2000 |

* cited by examiner

CLEANING PROCESS OF WAFER POLISHING PAD AND CLEANING NOZZLE

BACKGROUND OF THE INVENTION

1. Field of the Invention

The present invention relates to the field of semiconductor manufacturing processes, in particular to a method for cleaning a wafer polishing pad and a cleaning nozzle.

2. Description of the Prior Art

Chemical mechanical polishing (CMP) is a common planarization step, which is used to remove each material layer or part of the wafer, so that the surface of these material layers or wafers becomes flat. When the chemical mechanical polishing is carried out, the material layer is polished with slurry and a rapidly rotating polishing pad (also called CMP pad).

For effective polishing, the polishing pad has a rough surface (which may contain some groove structures). However, after the polishing pad is used for a period of time, some residues may accumulate on the surface of the polishing pad, which may be stuck in the grooves, for example, which will reduce the surface roughness of the polishing pad and further reduce the polishing efficiency.

SUMMARY OF THE INVENTION

The invention provides a cleaning process for a wafer polishing pad, which comprises providing a wafer polishing pad, performing a planarization step on a wafer by using the wafer polishing pad, leaving a residue on the wafer polishing pad after the planarization step, and performing a cleaning step with a cleaning nozzle to remove the residue, the cleaning nozzle comprises at least one Y-shaped pipe, one end of which is a water outlet, and the other two ends are respectively a water inlet and an air inlet, a cleaning liquid flows from the water inlet to the water outlet, and a pressurized gas flows in from the air inlet.

The invention also provides a cleaning nozzle, which comprises at least one Y-shaped pipe, one end of the Y-shaped pipe is a water outlet, and the other two ends are respectively a water inlet and an air inlet, wherein a cleaning liquid flows from the water inlet to the water outlet, and a pressurized gas flows in from the air inlet to strengthen the pressure of the cleaning liquid sprayed from the water outlet.

The present invention is characterized in that, due to the existing polishing pad cleaning process, the cleaning performance of the cleaning nozzle in the polishing machine is insufficient, and effective cleaning cannot be carried out. Therefore, the present invention improves the cleaning nozzle of the existing polishing machine, adds the air jet function, and pushes the water flow with gas, which can enhance the water pressure of the cleaning nozzle, and further effectively clean the polishing pad.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
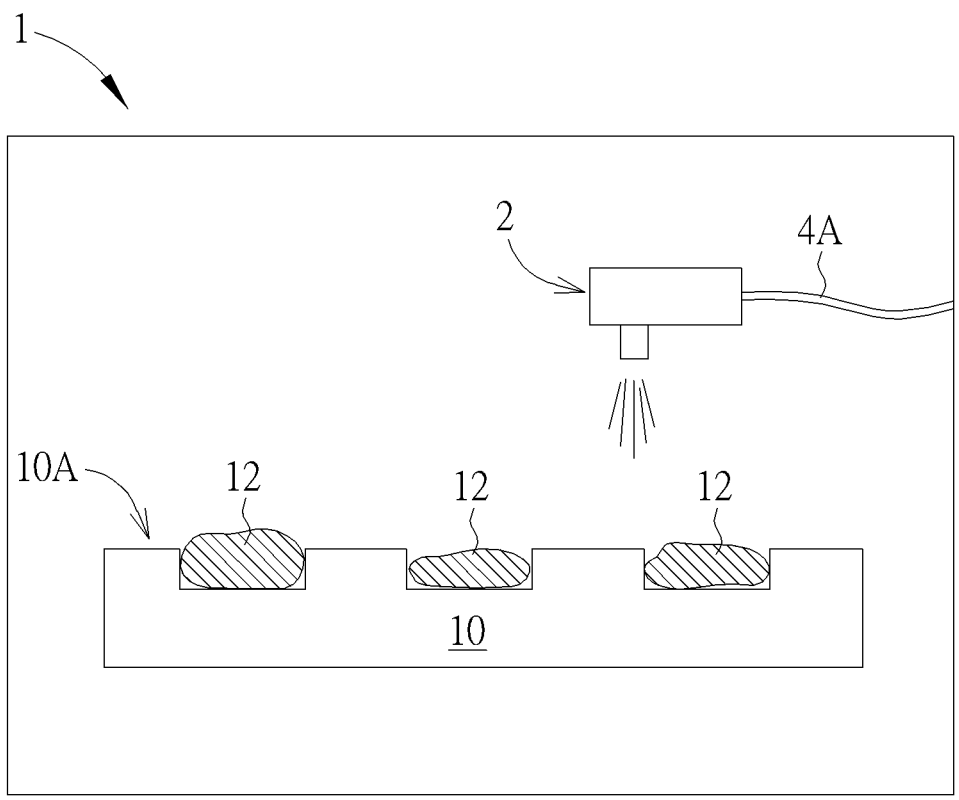
FIG. 1 is a schematic cross-sectional structure of cleaning a polishing pad with a cleaning nozzle in a polishing machine.

FIG. 1 is a schematic cross-sectional structure of cleaning a polishing pad with a cleaning nozzle in a machine. As shown in FIG. 1, a wafer polishing pad 10 is provided and installed in a polishing machine 1. The wafer polishing pad 10 is, for example, a polishing pad used in a chemical mechanical polishing (CMP) process, and its surface 10A is a rough surface. After the planarization step is performed with the wafer polishing pad 10 for a period of time, some impurities or residues 12 (such as materials removed in the planarization step, common residues such as materials including copper oxide, etc.) may get stuck in the grooves on the wafer polishing pad 10, which will reduce the polishing effect. Therefore, it is necessary to clean the polishing pad to remove impurities (residues) 12 on the wafer polishing pad 10 and prolong the service life of the wafer polishing pad 10.

In order to clean the wafer polishing pad 10, a common step is to use the built-in cleaning step of the polishing machine 1 for cleaning. The cleaning nozzle is built in the machine. Since the polishing pad needs to be cleaned every few pieces, it is impossible to remove the polishing pad and take it out of the machine for cleaning (which is time consuming). That is, the polishing machine 1 contains a cleaning nozzle 2 connected with a water pipe 4A, and the cleaning nozzle 2 directly sprays cleaning liquid such as deionized water inside the polishing machine 1 to remove impurities (residues) on the wafer polishing pad 10. However, according to the actual measurement results of the applicant, it is found that the cleaning nozzle 2 built in the polishing machine 1 still has insufficient cleaning effect on the wafer polishing pad 10. For example, after the cleaning step is completed, elements are detected at several different positions on the wafer polishing pad 10, and it is found that the residues still exist in some positions, for example, elements (such as copper) that do not belong to the material of the wafer polishing pad 10 can be detected, so it can be judged that the cleaning nozzle 2 built in the polishing machine 1 has insufficient cleaning effect on the wafer polishing pad 10.

On the other hand, if the wafer polishing pad 10 is removed from the polishing machine 1 and taken out of the polishing machine 1 for cleaning by other means, the processing time will be lengthened, which is not conducive to the production capacity.

Therefore, the present invention improves the polishing machine 1, especially improves the cleaning nozzle 2 inside the polishing machine 1, so that the cleaning ability of the cleaning nozzle 2 can be enhanced without removing the wafer polishing pad 10.

Figure 2:
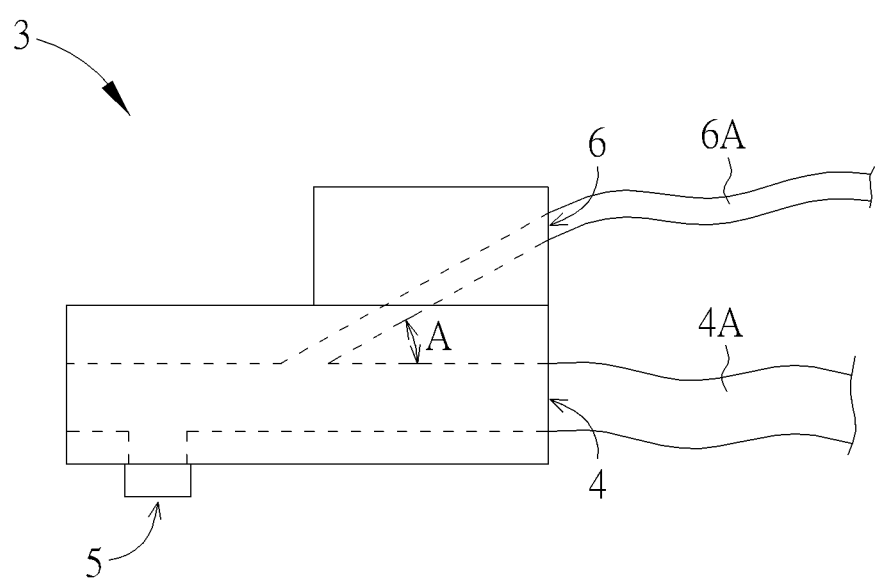
FIG. 2 is a schematic cross-sectional structure diagram of a cleaning nozzle in a polishing machine according to an embodiment of the present invention.

The method and structure provided by the present invention can refer to FIG. 2, which is a schematic cross-sectional structure diagram of a cleaning nozzle in a polishing machine according to an embodiment of the present invention. As shown in FIG. 2, the cleaning nozzle 3 is an improved cleaning nozzle. compared with the cleaning nozzle 2 shown in FIG. 1, the cleaning nozzle 3 is designed as a Y-shaped pipe, which includes a water inlet 4, a water outlet 5 and an air inlet 6, the water inlet 4 is connected with a water pipe 4A, and cleaning liquid (such as deionized water) flows into the water inlet 4 from the water pipe 4A, passes through the internal pipeline of the cleaning nozzle 3 and then flows out from the water outlet 5 to clean the wafer polishing pad 10.

The cleaning nozzle 3 also includes an air inlet 6, and an air pipe 6A is connected to the air inlet 6, so that a high-pressure gas (such as compressed nitrogen) can be introduced into the air inlet 6 from the air pipe 6A. In the internal structure of the cleaning nozzle 3, the angle a between the air inlet 6 and the water inlet 4 is less than 90 degrees. Therefore, after entering the cleaning nozzle 3, the high-pressure gas will be sprayed from the water outlet 5, and the velocity and pressure of the internal cleaning liquid will be intensified, so that the liquid and gas sprayed from the water outlet 5 will be strengthened.

It is worth noting that in the present invention, the cleaning liquid flowing in from the water inlet 4 may have been compressed before being introduced into the cleaning nozzle 3, so the cleaning liquid sprayed from the water outlet 5 also has a water pressure of about 40 psi to 50 psi after measurement before introducing gas from the air inlet 6. However, the applicant's experiment found that the above water pressure is sometimes not enough to clean the polishing pad completely. Therefore, the invention is characterized in that an air inlet 6 is additionally arranged to be connected with the cleaning nozzle 3. According to the applicant's test, after the compressed gas is introduced from the air inlet 6, the water pressure of the cleaning liquid sprayed from the water outlet 5 is increased to about 80 psi to 100 psi. In other words, the present invention uses high-pressure gas to increase the original high-pressure water again to improve its cleaning effect.

In addition, when the gas is introduced from the air inlet 6, it will be mixed with the cleaning liquid (for example, water containing nitrogen), which will be sprayed out of the cleaning nozzle 3. When cleaning the wafer polishing pad 10, the cleaning liquid containing gas will have a stronger impact effect on the wafer polishing pad 10. Taking deionized water containing nitrogen as an example, from the microscopic point of view, because the gas and liquid in the water alternately impact the target object (residue to be cleaned), it will produce a large vibration. In addition, the gas also helps to blow the residue away from the wafer polishing pad 10, which is helpful to improve the cleaning effect. Furthermore, a controller (not shown) can be used to control the gas flowing from the gas inlet 6, for example, the gas is introduced at repeated pulse manner, so that the impact of the water column can be further increased. In other words, since the pressurized gas pushes the cleaning liquid in a pulsed manner, the cleaning liquid also cleans the wafer polishing pad 10 in a pulsed manner to further remove residues on the wafer polishing pad 10.

Another feature of the present invention is that the original cleaning nozzle is built in the polishing machine, so its maximum water pressure is usually fixed and cannot be further raised. In this case, the present invention improves the original cleaning nozzle by changing the original single path from the water inlet to the water outlet into a Y-shaped pipe of the water inlet, the water outlet and the air inlet. The water pressure is further pushed by means of external gas, so that the cleaning efficiency of the cleaning nozzle is enhanced again. Therefore, with simple changes, the water pressure of cleaning nozzles can be enhanced. At the same time, there is no need to move the polishing pad out of the machine during the cleaning step, so the process time will not be excessively prolonged.

In an embodiment of the present invention, the cleaning liquid introduced into the water inlet 4 is deionized water, and the gas introduced into the air inlet 6 is preferably inert gas to avoid reaction with residues. In this embodiment, nitrogen is taken as an example of the gas, and the impurities (residues) remaining on the polishing pad are copper oxide, but the present invention is not limited to this. In other embodiments of the present invention, other cleaning liquids and other gases may be used to remove impurities (residues) remaining on the polishing pad.

To judge the cleanliness of the polishing pad after cleaning, it can be objectively known by elemental analysis. More specifically, a plurality of different positions of a cleaned polishing pad are sampled, and elemental analysis is carried out on each point. Because the impurity in this embodiment is copper oxide, attention should be paid to the residual amount of copper. Since copper does not belong to the material of the polishing pad itself, the residual amount of copper represents the cleaning degree of the polishing pad. The less copper residue, the cleaner the polishing pad is. If the polishing pad is cleaned in the conventional way (that is, the water pressure is not driven by high-pressure gas), the weight percentage of copper residue is about 2% on average. According to the experimental results of the applicant, when the improved cleaning nozzle of the present invention is used to clean the polishing pad, the weight percentage of copper element can be reduced to below 0.42%, while the copper residue at most points is below 0.1%, which means that the cleaning effect is improved.

Figure 3:
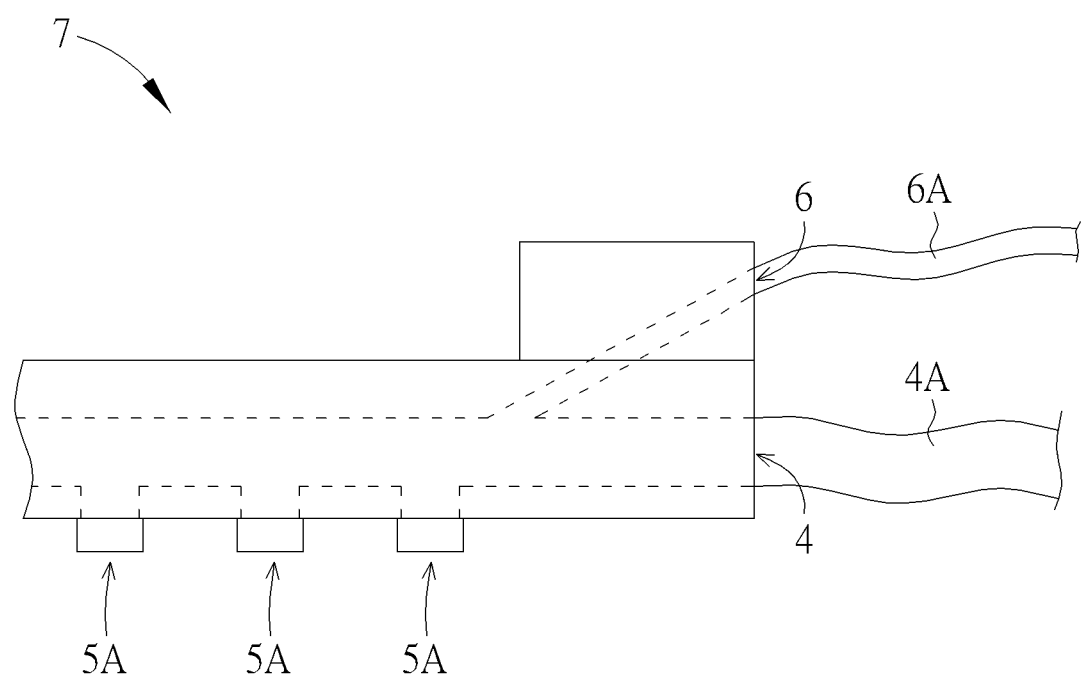
FIG. 3 is a schematic sectional view of a cleaning nozzle according to another embodiment of the present invention.

In addition, in other embodiments, the cleaning nozzle can also be designed to include a plurality of water outlets, so that multiple parts on the polishing pad can be cleaned simultaneously. FIG. 3 is a schematic sectional view of a cleaning nozzle according to another embodiment of the present invention. As shown in FIG. 3, the cleaning nozzle 7 also includes a water inlet 4 and an air inlet 6, which are connected with a water pipe 4A and an air pipe 6A, respectively. In this embodiment, the cleaning nozzle 7 includes a plurality of water outlets 5A, each of which can be arranged in strips or other shapes, for example, to clean a plurality of parts on the polishing pad at the same time. In this embodiment, the plurality of water outlets 5A share a water inlet 4 and an air inlet 6.

In other embodiments of the present invention, a plurality of cleaning nozzles shown in FIG. 2 can also be combined together to form an array composed of a plurality of cleaning nozzles, which is also within the scope of the present invention.

According to the above description and drawings, the present invention provides a cleaning process for a wafer polishing pad, which comprises providing a wafer polishing pad 10, performing a planarization step on a wafer (not shown) by using the wafer polishing pad 10, leaving a residue 12 on the wafer polishing pad 10 after the planarization step, and performing a cleaning step by using a cleaning nozzle 3 to remove the residue 12, the cleaning nozzle 3 comprises at least one Y-shaped pipe. One end of the Y-shaped pipe is a water outlet 5, and the other ends are a water inlet 4 and an air inlet 6, respectively, in which a cleaning liquid flows from the water inlet 4 to the water outlet 5 and a pressurized gas flows in from the air inlet 6.

In some embodiments of the present invention, the cleaning liquid comprises deionized water.

In some embodiments of the present invention, pressurized gas is introduced from the air inlet 4, and the pressure of the cleaning liquid sprayed from the water outlet 5 is increased.

In some embodiments of the present invention, the pressurized gas comprises an inert gas.

In some embodiments of the present invention, the pressurized gas is introduced from the air inlet 4 in a pulsed manner.

In some embodiments of the present invention, when the pressurized gas is not introduced from the air inlet, the pressure of the cleaning liquid at the water outlet is between 40 psi and 50 psi.

In some embodiments of the present invention, when pressurized gas is introduced from the air inlet, the pressure of the cleaning liquid at the water outlet is between 80 psi and 100 psi.

In some embodiments of the present invention, the residue 12 comprises copper oxide.

In some embodiments of the present invention, the cleaning nozzle 3 further comprises a strip structure in which a plurality of groups of Y-shaped pipes are arranged.

In some embodiments of the present invention, a diameter of the air inlet 6 is smaller than a diameter of the water inlet 4 and the water outlet 5.

In some embodiments of the present invention, after the cleaning step, a point is taken on the wafer polishing pad, the residue contained in this point accounts for less than 0.5% of all components.

In some embodiments of the present invention, the cleaning nozzle 3 and the wafer polishing pad 10 are built in the same polishing machine 1.

The invention also provides a cleaning nozzle 3, which comprises at least one Y-shaped pipe, one end of the Y-shaped pipe is a water outlet 5, and the other two ends are a water inlet 4 and an air inlet 6 respectively, a cleaning liquid flows from the water inlet 4 to the water outlet 5, and a pressurized gas flows in from the air inlet 6, so as to enhance the pressure of the cleaning liquid sprayed from the water outlet 5.

The present invention is characterized in that, due to the existing polishing pad cleaning process, the cleaning performance of the cleaning nozzle in the polishing machine is insufficient, and effective cleaning cannot be carried out. Therefore, the present invention improves the cleaning nozzle of the existing polishing machine, adds the air jet function, and pushes the water flow with gas, which can enhance the water pressure of the cleaning nozzle, and further effectively clean the polishing pad.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cleaning process for a wafer polishing pad, comprising:
   providing a wafer polishing pad;
   performing a planarization step on a wafer by using the wafer polishing pad, and leaving a residue on the wafer polishing pad after the planarization step; and
   performing a cleaning step with a cleaning nozzle to remove the residue, wherein the cleaning nozzle comprises at least one Y-shaped pipe, one end of the Y-shaped pipe is a water outlet of a plurality of water outlets, and the other two ends of the Y-shaped pipe are respectively a water inlet and an air inlet, wherein cleaning liquid flows from the water inlet to the plurality of water outlets and a pressurized gas flows in from the air inlet, the air inlet is disposed above the water inlet, and the water inlet is arranged in a horizontal direction at a junction of the water inlet and the air inlet, and the plurality of water outlets are arranged in a downward direction.

2. The cleaning process for the wafer polishing pad according to claim 1, wherein the cleaning liquid comprises deionized water.

3. The cleaning process for the wafer polishing pad according to claim 1, wherein the pressurized gas is introduced from the air inlet and increases the pressure of the cleaning liquid sprayed from the water outlet.

4. The cleaning process for the wafer polishing pad according to claim 3, wherein the pressurized gas comprises an inert gas.

5. The cleaning process for the wafer polishing pad according to claim 3, wherein when the pressurized gas is not introduced from the air inlet, the pressure of the cleaning liquid at the water outlet is between 40 psi and 50 psi.

6. The cleaning process for the wafer polishing pad according to claim 3, wherein when the pressurized gas is introduced from the air inlet, the pressure of the cleaning liquid at the water outlet is between 80 psi and 100 psi.

7. The cleaning process for the wafer polishing pad according to claim 1, wherein the pressurized gas is introduced from the air inlet in a pulsed manner.

8. The cleaning process for the wafer polishing pad according to claim 1, wherein a pipe diameter of the air inlet is smaller than a pipe diameter of the water inlet and the water outlet.

9. The cleaning process for the wafer polishing pad according to claim 1, wherein the cleaning nozzle and the wafer polishing pad are integrated in a same polishing machine.

10. A cleaning nozzle comprising:
   at least one Y-shaped pipe, wherein one end of the Y-shaped pipe is water outlet of a plurality of water outlets, and the other two ends are a water inlet and an air inlet respectively, wherein the cleaning nozzle is configured to have a cleaning liquid flows from the water inlet to the plurality of water outlets, and a pressurized gas flows in from the air inlet to strengthen the pressure of the cleaning liquid sprayed from the water outlet, the air inlet is disposed above the water inlet, and the water inlet is arranged in a horizontal direction at a junction of the water inlet and the air inlet, and the plurality of water outlets are arranged in a downward direction.

11. The cleaning nozzle according to claim 10, wherein the cleaning liquid comprises deionized water.

12. The cleaning nozzle according to claim 10, wherein the pressurized gas comprises an inert gas.

13. The cleaning nozzle according to claim 10, wherein a pipe diameter of the air inlet is smaller than a pipe diameter of the water inlet and a pipe diameter of the water outlet.

14. The cleaning nozzle according to claim 10, wherein the cleaning nozzle is integrated in a polishing machine.

* * * * *